(12) United States Patent
Doglio et al.

(10) Patent No.: US 11,281,263 B2
(45) Date of Patent: Mar. 22, 2022

(54) SYSTEMS AND METHODS FOR VIBRATION ISOLATION

(71) Applicant: Dell Products L.P., Hopkinton, MA (US)

(72) Inventors: Jean Marie Doglio, Austin, TX (US); Daniel J. Carey, Austin, TX (US); Russell Conley Smith, Taylor, TX (US)

(73) Assignee: Dell Products L.P., Hopkinton, MA (US)

( * ) Notice: Subject to any disclaimer, the term of this patent is extended or adjusted under 35 U.S.C. 154(b) by 0 days.

(21) Appl. No.: 16/926,617

(22) Filed: Jul. 10, 2020

(65) Prior Publication Data

US 2022/0011831 A1  Jan. 13, 2022

(51) Int. Cl.
*G06F 1/18* (2006.01)
(52) U.S. Cl.
CPC .............. *G06F 1/183* (2013.01); *G06F 1/181* (2013.01)
(58) Field of Classification Search
CPC .................................. G06F 1/183; G06F 1/181
See application file for complete search history.

(56) References Cited

U.S. PATENT DOCUMENTS

| | | | | |
|---|---|---|---|---|
| 8,953,329 | B1* | 2/2015 | Heydari | G06F 1/181 361/732 |
| 9,520,158 | B1* | 12/2016 | Lyu | G11B 33/123 |
| 9,743,547 | B1* | 8/2017 | Amin-Shahidi | G11B 33/128 |
| 2004/0195409 | A1 | 10/2004 | Berger et al. | |
| 2007/0230106 | A1* | 10/2007 | Yeh | G06F 1/187 361/679.33 |

\* cited by examiner

*Primary Examiner* — Rockshana D Chowdhury
(74) *Attorney, Agent, or Firm* — Chamberlain, Hrdlicka, White, Williams & Aughtry

(57) ABSTRACT

A modular compute chassis, that includes a chassis divider wall assembly that includes a chassis grommet wall that includes a first side, a second side, and a hole; a grommet that includes a groove and at least partially disposed within the hole and mechanically coupled to the chassis grommet wall using the groove; and a first compute unit cage wall in contact with a first portion of the grommet, where the first portion of the grommet is interposed between the first compute unit cage wall and the first side; and a second compute unit cage wall in contact with a second portion of the grommet, where the second portion of the grommet is interposed between the second compute unit cage wall and the second side, where the second compute unit cage wall is rigidly mechanically coupled to the first compute unit cage wall.

19 Claims, 7 Drawing Sheets

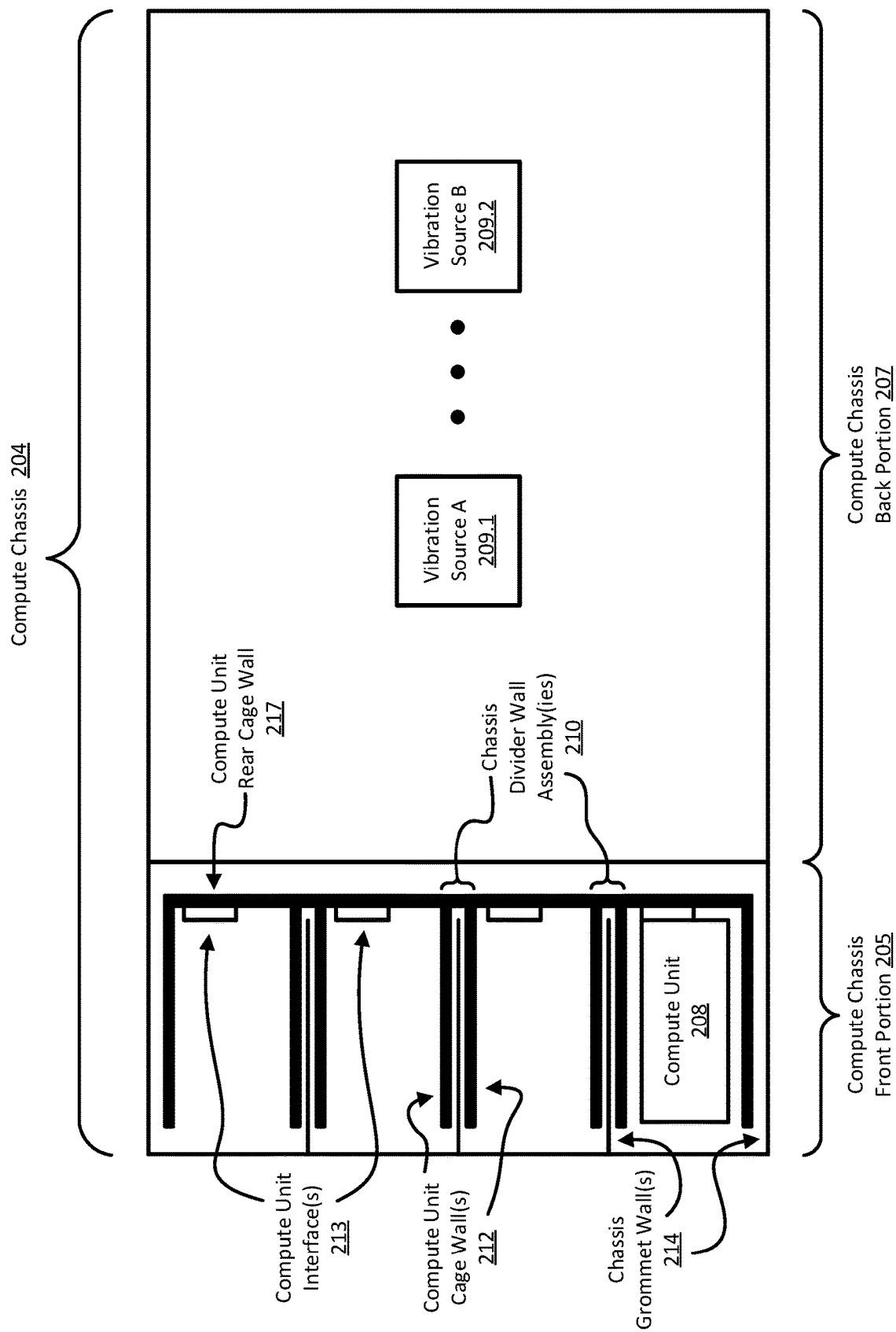
FIG. 2.1

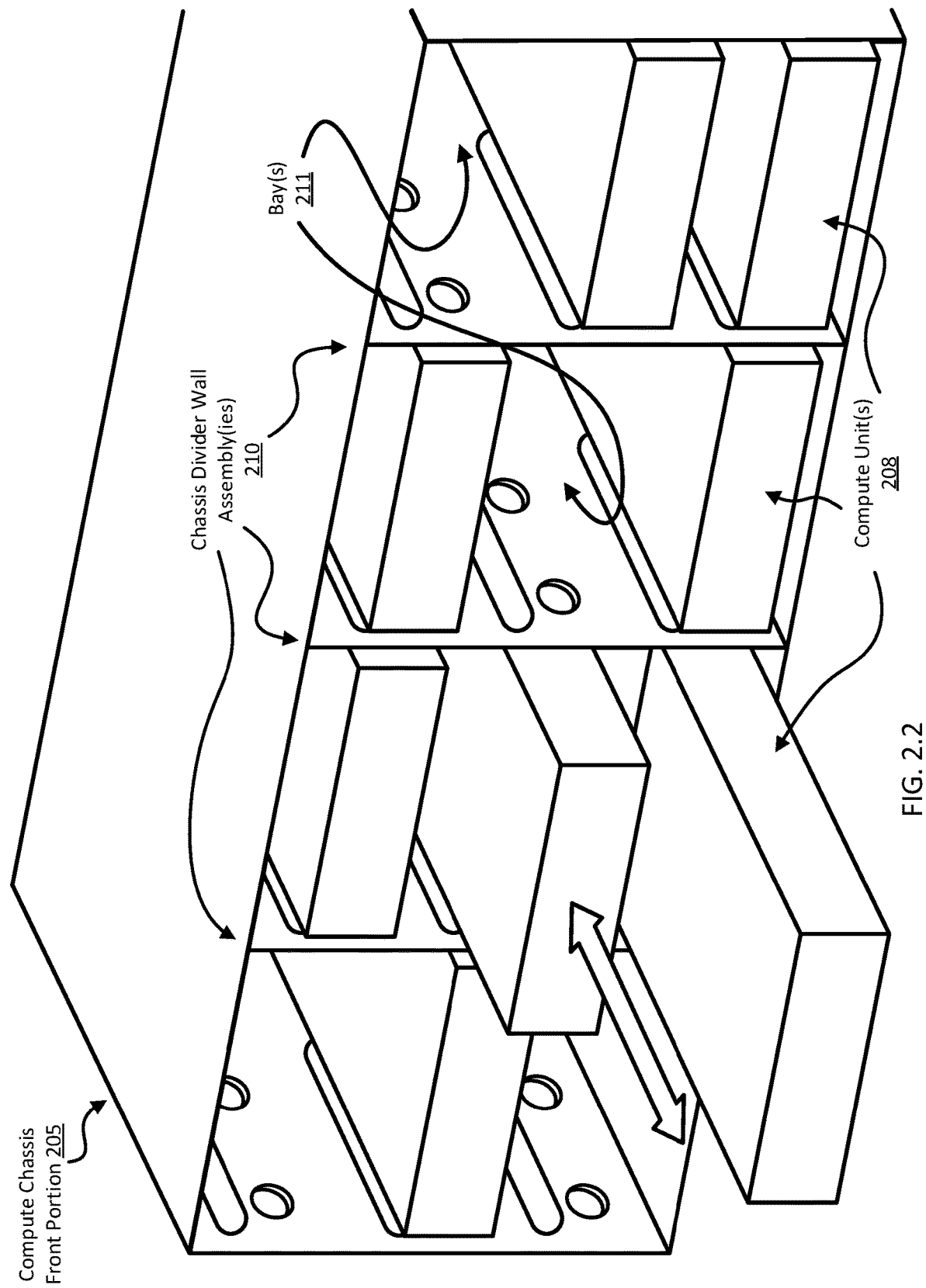
FIG. 2.2

SYSTEMS AND METHODS FOR VIBRATION ISOLATION

BACKGROUND

Devices and/or components of devices are often capable of performing certain functionalities that other devices and/or components are not configured to perform and/or are not capable of performing. In such scenarios, it may be desirable to adapt one or more systems to enhance the functionalities of devices and/or components that cannot perform the one or more functionalities.

SUMMARY

In general, in one aspect, embodiments relate to a modular compute chassis, that includes a chassis divider wall assembly that includes a chassis grommet wall that includes a first side, a second side, and a hole; a grommet that includes a groove and at least partially disposed within the hole and mechanically coupled to the chassis grommet wall using the groove; and a first compute unit cage wall in contact with a first portion of the grommet, where the first portion of the grommet is interposed between the first compute unit cage wall and the first side; and a second compute unit cage wall in contact with a second portion of the grommet, where the second portion of the grommet is interposed between the second compute unit cage wall and the second side, where the second compute unit cage wall is rigidly mechanically coupled to the first compute unit cage wall.

In general, in one aspect, embodiments relate to an information handling system, that includes a chassis divider wall assembly that includes a chassis grommet wall that includes a first side, a second side, and a hole; a grommet that includes a groove and at least partially disposed within the hole and mechanically coupled to the chassis grommet wall using the groove; and a first compute unit cage wall in contact with a first portion of the grommet, where the first portion of the grommet is interposed between the first compute unit cage wall and the first side; and a second compute unit cage wall in contact with a second portion of the grommet, where the second portion of the grommet is interposed between the second compute unit cage wall and the second side, where the second compute unit cage wall is rigidly mechanically coupled to the first compute unit cage wall.

Other aspects of the invention will be apparent from the following description and the appended claims.

BRIEF DESCRIPTION OF DRAWINGS

FIG. 2.1 shows a top view diagram of a compute chassis, in accordance with one or more embodiments of the invention.

FIG. 2.2 shows a diagram of a front portion of a compute chassis, in accordance with one or more embodiments of the invention.

DETAILED DESCRIPTION

Figure 1:
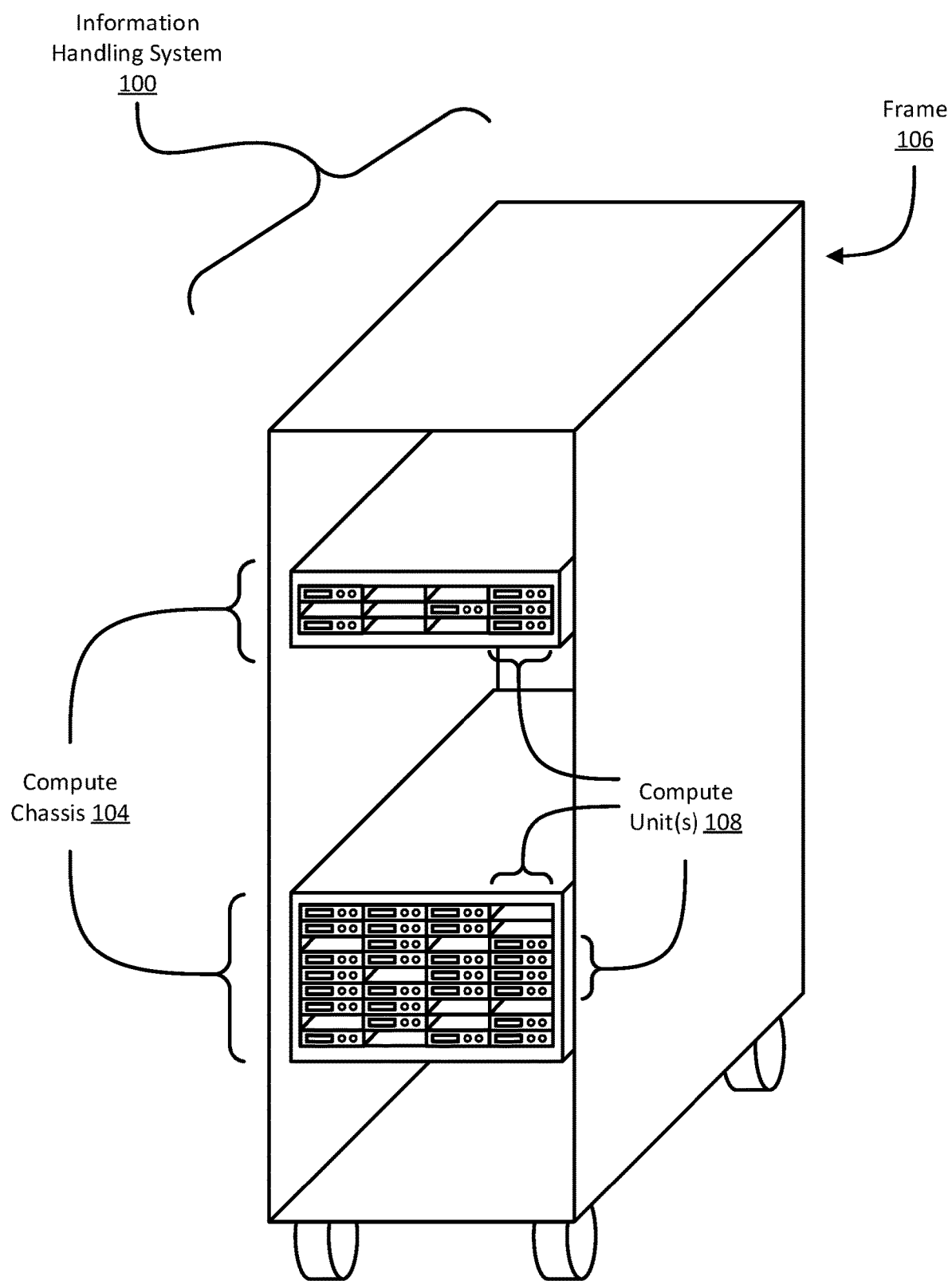
FIG. 1 shows a diagram of information handling system, in accordance with one or more embodiments of the invention.

In general, embodiments of the invention relate to systems and methods for reducing vibrations experienced by one or more compute unit(s) (e.g., a hard disk drive (HDD), a riser card, a solid-state drive (SSD), etc.) via isolation (i.e., providing a physical separation between the compute unit and source of vibration) and damping (i.e., reducing the amplitudes of vibrations by dissipating the energy). In one or more embodiments of the invention, a compute unit may experience vibrations through an enclosure (e.g., compute chassis) that includes the compute unit and other components near or affixed to that larger enclosure. Non-limiting examples of the sources of vibration include fans, other compute units, external impacts against the enclosure, acoustical energy, airflow turbulence, and/or any other moving object.

Specifically, for a compute unit that is an HDD, an HDD may be sensitive to vibrations such that the HDD may misread and/or miswrite data while experiencing vibration. Specifically, in one or more embodiments of the invention, one or more read/write head(s) of an HDD may be moved into an unwanted position due to vibrations transmitted through the enclosure. And, as a result, one or more read/write head(s) may be unable to read data from the HDD platter (or fail to write data to the HDD platter). In such circumstances, the HDD may be configured to automatically detect that the desired operation was unsuccessful and reattempt the original read/write action.

However, despite the ability of an HDD to automatically correct errors, there is still a reduction in performance of the HDD as time and energy are consumed re-attempting the read/write operation that initially failed. Therefore, it may be desirable to reduce the vibration experienced by the HDD to improve overall performance. In one or more embodiments of the invention, HDD errors caused by vibrations may be measured by their effect on the input-output operations per second (IOPS) of the HDD. For example, an HDD under ideal conditions may be able to performs 100 IOPS. However, when experiencing vibration, that same HDD may only successfully perform 75 IOPS, from which it may be concluded that the vibration is causing a 25% reduction in IOPS performance of the HDD. Further, the natural frequencies of the enclosure may exacerbate vibrations if the source of the vibration happens to peak at those natural frequencies.

Accordingly, in one or more embodiments of the invention, described herein, one or more compute unit(s) may be, at least partially, isolated from vibrations resonating throughout the enclosure. Specifically, one or more embodiments herein discloses installing vibration isolators (e.g., grommets) between every mechanical coupling that separates a compute unit cage assembly (or the compute unit alone) from its larger enclosure.

Specific embodiments will now be described with reference to the accompanying figures. In the following description, numerous details are set forth as examples of the invention. One of ordinary skill in the art, having the benefit of this detailed description, would appreciate that one or more embodiments of the present invention may be practiced without these specific details and that numerous variations or modifications may be possible without departing from the scope of the invention. Certain details known to those of ordinary skill in the art may be omitted to avoid obscuring the description.

In the following description of the figures, any component described with regard to a figure, in various embodiments of the invention, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments of the invention, any description of any component of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the term 'operatively connected', or 'operative connection', means that there exists between elements/components/devices a direct or indirect connection that allows the elements to interact with one another in some way (e.g., via the exchange of information). For example, the phrase 'operatively connected' may refer to any direct (e.g., wired connection or wireless connection directly between two devices) or indirect (e.g., wired and/or wireless connections between any number of devices connecting the operatively connected devices) connection.

As used herein, the term 'mechanically coupled' means two components are attached (e.g., affixed, connected, linked, contacting, etc.) such that their independent movement is constrained by their attachment the other component. As used herein, 'directly mechanically coupled' means that two components are in direct physical contact and are mechanically coupled. Additionally, as used herein, 'rigidly mechanically coupled' means that two components are mechanically coupled such that all rotations and translations of one component also occur to the other component. Lastly, as used herein, 'flexibly mechanically coupled' means that two components are mechanically coupled such that certain rotations and translations of one component are not transferred to the other component.

FIG. 1 shows a diagram of information handling system, in accordance with one or more embodiments of the invention. The information handling system (100) may include a frame (e.g., frame (106)) and one or more compute chassis (e.g., compute chassis (104)). The components of the example information handling system (100) may include mounting capabilities to mount one or more compute chassis (104). By doing so, devices may be stacked in a high-density computing environment.

In one or more embodiments of the invention, the information handling system (100) is a physical structure. The information handling system (100) may include a frame (e.g., frame (106)) that may be adapted to facilitate storage of one or more compute chassis (104) in a high-density computing environment. The high-density computing environment may be, for example, a data center or another type of location where one or more compute chassis (104) are located.

The frame (106) may be constructed using any number of suitable materials. For example, portions of the frame (106) may be implemented using metals (e.g., steel, aluminum, etc.). In another example, portions of the frame (106) may be implemented using polymers (e.g., polyamides, polycarbonates, polyester, polyethylene, polypropylene, polystyrene, polyurethanes, polyvinyl chloride, etc.). As another example, portions of the frame (106) may be implemented using rubber (e.g., latex, styrene-butadiene rubbers, etc.). One of ordinary skill in the art, having the benefit of this detailed description, would appreciate that the frame (106) may be implemented using any quantity and combination of suitable materials without departing from the scope of this invention.

To facilitate mounting of one or more compute chassis (104), the frame (106) may include any number of structural members (e.g., beams, brackets, bars, etc.) and any number of mechanical mounting points (e.g., holes, threaded portions, etc.) disposed on the structural members to facilitate storage of a compute chassis (104). Different structural members may have different shapes, sizes, and/or other physical characteristics. The shapes, sizes, and/or other physical characteristics of the structural members may be adapted to enable the structural members to be mechanically connected (e.g., permanently, or reversibly, connected) to each other to form a predetermined structure. The predetermined structure may be, for example, a cage, box, or other type of structure that facilitates positioning and/or orienting one or more compute chassis (104).

When all, or a portion, of the structural members are mechanically connected to each other, the mechanical mounting points may be disposed at predetermined locations. The predetermined locations may correspond to similar predetermined locations on a compute chassis (104) where mechanical mounting elements, complementary to the mechanical mounting points, are disposed. By doing so, the frame (106) may be adapted to position a compute chassis (104) in locations and/or orientations suitable for a high-density computing environment, or another environment in which a compute chassis (104) may be located. The mechanical mounting points may be any type of physical structure for mechanically coupling (permanently or reversibly) a compute chassis (104) to the frame (106). There may be any number of mechanical mounting points to facilitate the mechanical coupling of any number of corresponding compute chassis (104).

To facilitate mechanical coupling of a compute chassis (104) to the frame, the compute chassis (104) may include any number of mechanical mounting elements. The mechanical mounting elements may be located at predetermined locations. For example, a mechanical mounting element may be a rail disposed on a side of a compute chassis (104). The location of the rail may correspond to a position on the frame (106) where a rail guide (i.e., a complementary mechanical mounting point) is disposed. The rail and the rail guide may facilitate mechanical coupling of a compute chassis (104) to the frame (106) which, in turn, positions and orients a compute chassis (104) relative to the frame (106) and information handling system (100), generally.

In one or more embodiments of the invention, a compute chassis (e.g., compute chassis (104)) is a physical device that houses one or more components (e.g., compute unit(s) (108)) in one or more bay(s). In one embodiment of the invention, a compute chassis (104) may have different configurations and/or uses within the information handling system (100). In one or more embodiments of the invention, an information handling system (100) may include any number and combination of compute chassis (104) adapted for any number of different uses and/or sizes without departing from the scope of the invention. By way of example, compute chassis (104) may execute a server for hosting a website, or alternatively, compute chassis (104) may host a media server, which stores media files. Further, one compute chassis (104) may be of a larger physical size than another compute chassis (104) and, consequently, may be capable of housing more and/or larger compute units (e.g., compute unit(s) (108)) therein. Additional detail regarding the description of a compute chassis (104) and a compute unit(s) (108) is provided in the description of FIG. 2.2.

In one or more embodiments of the invention, a compute chassis (104) extends from a front side (i.e., the side forwardly depicted in FIG. 1) of the information handling system (100) to a rear side (not shown) of the information handling system (100). Thus, in one embodiment of the invention, a front of a compute chassis (104) may be accessible from a front of an information handling system (100) while a rear side of a compute chassis (104) may be accessible from a rear side of the information handling system (100).

While the example information handling system (100) of FIG. 1 has been illustrated as including a limited number of components, an information handling system (100) in accordance with embodiments of the invention may include any number of frames, compute chassis, compute units, and/or other components without departing from the invention. For example, any number of frames (and/or other types of physical devices for positioning/orienting devices) may be used in a high density computing environment to facilitate the placement and/or orientation of any number of compute chassis and/or compute units. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame may be used in conjunction with any number and/or type of other device without departing from the invention.

While FIG. 1 shows a specific configuration of an information handling system, other configurations may be used without departing from the scope of the invention. Accordingly, embodiments disclosed herein should not be limited to the configuration of devices and/or components shown in FIG. 1.

FIG. 2.1 shows a top view diagram of a compute chassis, in accordance with one or more embodiments of the invention. In one embodiment of the invention, a compute chassis (e.g., compute chassis (204)) may be divided into two portions, a compute chassis front portion (e.g., compute chassis front portion (205)) and a compute chassis back portion (e.g., compute chassis back portion (207)).

In one or more embodiments of the invention, a compute chassis (e.g., compute chassis (204)) is a mechanical device that is adapted to (i) house one or more compute unit(s) (208), (ii) provide electrical operative connection(s) (e.g., peripherals) to one or more compute unit(s) (208) (e.g., for electrical power and/or communications), and/or (iii) provide shared resources to one or more compute unit(s) (208).

In one or more embodiments of the invention, the compute chassis front portion (205) is a modular unit that may hold one or more similar compute unit(s) (208) in an array or grid alignment. Further, the compute chassis front portion (205) may be forward-facing (i.e., orientated and aligned to match a face of the information handling system) such a user can access one or more compute unit(s) disposed therein.

As shown in FIG. 2.1, the compute chassis front portion (205) includes compute unit cage wall(s) (212) and a compute unit rear cage wall (217). In one or more embodiments of the invention, the compute unit rear cage wall (217) is rigidly mechanically coupled to each compute unit cage wall (212) thereby forming a rigid structure in which compute units (208) may be installed. Further, while the compute unit cage wall(s) (212) form a rigid structure with the compute unit rear cage wall (217), the compute unit cage wall(s) (212) may also be part of a chassis divider wall assembly (e.g., chassis divider wall assembly (210)) that additionally includes a chassis grommet wall (e.g., chassis grommet wall (214)). Further, in one or more embodiments of the invention, the compute unit cage wall(s) (212) and the chassis grommet wall (214) are flexibly mechanically coupled using one or more grommets (not shown) disposed in the chassis divider wall assembly (210). Accordingly, the outer structure of the compute chassis front portion (205) and inner chassis grommet wall(s) (214) may form a rigid structure independent of the rigid structure formed by the compute unit cage walls (212) and compute unit rear cage wall (217). Additional detail regarding the description of a chassis divide wall assembly(ies) (210) is provided in the description of FIG. 3.

In one or more embodiments of the invention, the compute chassis front portion (205) provides electrical power (e.g., power) and communication capabilities to one or more compute unit(s) (208) via one or more respective compute unit interface(s) (213). The compute unit interface(s) (213) may provide electrical power and/or data communications via one or more conductive operative connection(s) (e.g., metallic contacts and/or wire(s) terminated with a plug and socket). The compute chassis (204) may be provided power from an information handling system (not shown) or via some other source, which is then distributed to the components of the compute chassis front portion (205) and the compute chassis back portion (207). Further, as shown in FIG. 2.1, the compute unit interface(s) (213) are disposed on the compute unit rear cage wall (217) such a compute unit (208) remains only flexibly mechanically coupled to the larger compute chassis front portion (205) (i.e., is not rigidly mechanically coupled to the compute chassis front portion (205) or compute chassis (204), generally). Accordingly, vibrations experienced by the compute chassis front portion (205) are sufficiently isolated (or are substantially damped) from one or more compute unit(s) (208). Additional detail regarding the description of a compute chassis front portion (205) is provided in the description of FIG. 2.2.

In one or more embodiments of the invention, the compute chassis back portion (207) includes one or more vibration source(s) (e.g., vibration source A (209.1) and vibration source B (209.2)). In one or more embodiments of the invention, a vibration source (209.1, 209.2) is a device that includes one or more moving parts that, when moving, generate vibrations in the structure(s) to which the vibration source (209.1, 209.2) is attached. Non-limiting examples of a vibration source (209.1, 209.2) include a fan, a HDD, or any component that includes a moving part.

While FIG. 2.1 shows a specific configuration of a compute chassis, other configurations may be used without departing from the scope of the invention. Accordingly, embodiments disclosed herein should not be limited to the configuration of devices and/or components shown in FIG. 2.1.

FIG. 2.2 shows a diagram of a front portion of a compute chassis, in accordance with one or more embodiments of the invention. Specifically, as shown in FIG. 2.2, the compute chassis front portion (e.g., compute chassis front portion (205)) is depicted. In one embodiment of the invention, the front side of a compute chassis front portion (205) allows for access to one or more compute unit(s) (208). In one embodiment of the invention, the compute chassis front portion (205) further includes one or more chassis divider wall assembly(ies) (e.g., chassis divider wall assembly(ies) (210)).

In one embodiment of the invention, a casing forms the exterior structure of the compute chassis front portion (205). The casing of the compute chassis front portion (205) may be constructed using any number of suitable materials. For example, portions of the casing may be implemented using metals (e.g., steel, aluminum, etc.) or other rigid materials. The casing may be implemented using any quantity and combination of suitable materials without departing from the invention.

To house the one or more compute unit(s) (208), the casing may include one or more bay(s) (e.g., bay(s) (211)). One or more bay(s) (211) may facilitate disposing of the one or more compute unit(s) (208) (and/or other devices) within a compute chassis front portion (205). For example, the bay(s) (211) may have a shape or other characteristic(s) that facilitates disposing of the one or more compute unit(s) (208) (e.g., a rectangular void capable of housing one or more compute unit(s) (208) and/or other devices).

In one or more embodiments of the invention, a compute unit (208) may translate (e.g., slide) into an unoccupied bay (211) (e.g., the top-right bay shown in FIG. 2.2) of a compute chassis (204). In one embodiment of the invention, a compute unit (208) is constructed to have a physical size that is slightly smaller than the cavity created by bay (211) thereby allowing for the insertion of the compute unit (208) into the compute chassis front portion (205).

In one or more embodiments of the invention, the geometry of the bay (211) and the compute unit (208) provides tolerances that allows for automatic alignment of power and communication interfaces disposed on a rear side (the side being inserted first into the bay (211)) of the compute unit (208) and disposed on a compute unit rear cage wall (as shown in FIG. 2.1) of the compute chassis. Accordingly, in one or more embodiments of the invention, a compute unit (208) may be "hot swappable" such that the compute unit (208) may be removed (and replaced) when the power and communication interfaces are actively transmitting power and data.

In one or more embodiments of the invention, a chassis divider wall assembly (e.g., chassis divider wall assembly(ies) (210)) is structure disposed within, and rigidly mechanically coupled to, the compute chassis (204). Further the chassis divider wall assembly (210) may be adapted to provide one or more component(s) (not shown) that facilitate mechanically coupling a compute unit (208) into a bay (211). Further, once one or more mechanical coupling components are engaged, a compute unit (208) may not be separated from the chassis divider wall assembly (210) without first disengaging those one or more mechanical coupling component(s) (to allow for the translation of a compute unit (208) out of and away from the compute chassis (204)).

For example, a compute unit (208) may rigidly mechanically couple to a chassis divider wall assembly (210) via means for mechanical coupling (e.g., latches, clip(s), sliding rails) that utilize the elasticity and/or shape of the attaching means to removably attach the two devices (208, 210). As another example, a compute unit (208) may mechanically couple to a chassis divider wall assembly (210) via rigid fasteners (e.g., screws, nails, pins, etc.) that traverse one or more aligned mounting points (e.g., holes) of the compute unit (208). One of ordinary skill in the art, having the benefit of this detailed description, would appreciate that any fixing means (suitable to mechanically couple two physical objects) may be utilized to mechanically couple a compute unit (208) to a chassis divider wall assembly (210). Additional details regarding the description of a chassis divider wall assembly (e.g., chassis divider wall assembly (210)) is provided in the description of FIG. 3.

In one embodiment of the invention, a compute unit (e.g., compute unit(s) (208)) is device that includes one or more components(s) and/or an empty volume suitable to store one or more other devices. Non-limiting examples of a compute unit (208) include a hard disk drive (HDD), a solid-state drive (SSD), a riser card, a modular computing unit, a power supply, a server, etc.

While FIG. 2.2 shows a specific configuration of a front section of a compute chassis, other configurations may be used without departing from the scope of the invention. Accordingly, embodiments disclosed herein should not be limited to the configuration of devices and/or components shown in FIG. 2.2.

Figure 3:
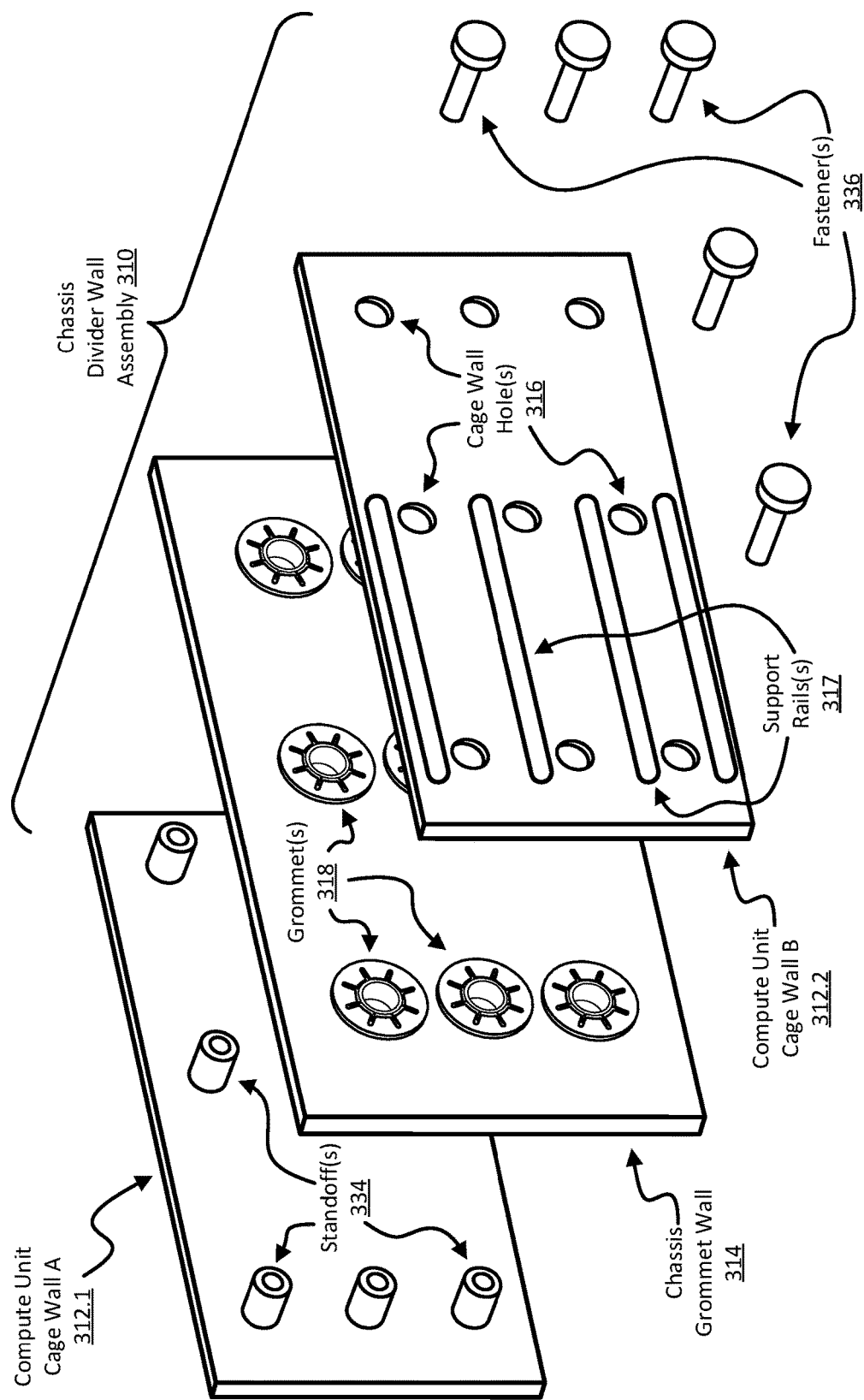
FIG. 3 shows an exploded diagram of a chassis divider wall assembly, in accordance with one or more embodiments of the invention.

FIG. 3 shows an exploded diagram of a chassis divider wall assembly, in accordance with one or more embodiments of the invention. The chassis divider wall assembly (310) may include one or more compute unit cage wall(s) (e.g., compute unit cage wall A (312.1) and compute unit cage wall B (312.2)), a chassis grommet wall (e.g., chassis grommet wall (314)), and one or more fastener(s) (e.g., fastener(s) (336)). Each of these components is described below.

In one or more embodiments of the invention, a compute unit cage wall (e.g., compute unit cage wall A (312.1) and compute unit cage wall B (312.2)) is a structure that provides means for mechanically coupling to a compute unit (not shown). A compute unit cage wall (312.1, 312.2) may include one or more cage wall hole(s) (e.g., cage wall hole(s) (316)), one or more support rail(s) (e.g., support rail(s) (317)), and/or one or more standoff(s) (e.g., standoff(s) (334)). Each of these components is described below.

In one or more embodiments of the invention, a cage wall hole (e.g., cage wall hole(s) (316)) is through hole that traverses the thickness of a compute unit cage wall (312.1, 312.2). A cage wall hole (316) may align with a standoff (334) of an opposing compute unit cage wall (e.g., compute unit cage wall A (312.1)) such that a fastener (e.g., fastener(s) (336)) may protrude through the cage wall hole(s) (316), grommet(s) (318), and standoff(s) (334) and be exposed on the opposite side of the opposing compute unit cage wall (e.g., compute unit cage wall A (312.1)).

In one or more embodiments of the invention, a support rail (e.g., support rail(s) (317)) is a protrusion that extends orthogonally from the surface of a compute unit cage wall (312.1, 312.2) and provides additional support and/or mechanical guidance for a compute unit. As a non-limiting example, a compute unit may be located vertically above and below two or more support rails (317) thereby preventing the compute unit from translating vertically beyond the physical constraints of the support rail(s) (317)).

In one or more embodiments of the invention, a chassis grommet wall (e.g., chassis grommet wall (314)) is structure that provides means for rigidly mechanically coupling to interior surfaces of the compute chassis. In one or more embodiments of the invention, a chassis grommet wall (314) may include one or more grommet(s) (e.g., grommet(s) (318)) installed in and around through holes that traverse the thickness of the chassis grommet wall (314).

Further the chassis grommet wall (314) may be disposed (e.g., interposed) between two compute unit cage walls (312.1, 312.2) or between one compute unit cage wall (312.1, 312.2) and a side of the compute chassis (not shown). In one or more embodiments of the invention, a compute unit cage wall (312.1, 312.2) is flexibly mechanically coupled to the chassis grommet wall (314) via one or more grommet(s) (318).

In one or more embodiments of the invention, a grommet (e.g., grommet (318)) is hardware that provides mechanical coupling of one component (e.g., a chassis grommet wall (314)) to one or more other component(s) (e.g., a compute unit cage wall (312.1, 312.2)). Further, a grommet (318) may provide vibration isolation and damping between two or more mechanically coupled components that are indirectly mechanically coupled via the grommet (318)—thereby making those two components 'flexibly mechanically coupled'. Accordingly, movements (e.g., vibrations) felt by the compute chassis that resonate through the rigidly mechanically coupled chassis grommet wall (314) are reduced and do not resonate as strongly into the compute unit cage walls (312.1, 312.2) via the grommet (318). More details regarding the description of a grommet (e.g., grommet (318)) is provided in the description of FIG. 5.

While FIG. 3 shows a specific configuration of a chassis divider wall assembly, other configurations may be used without departing from the scope of the invention. For example, although chassis divider wall assembly(ies) (310) are shown and described to be disposed throughout the compute chassis, each side of the compute chassis may further include a chassis divider wall assembly (310) that includes only a chassis grommet wall (314) and one computer unit cage wall (312.1, 312.2). Accordingly, embodiments disclosed herein should not be limited to the configuration of devices and/or components shown in FIG. 3.

Figure 4:
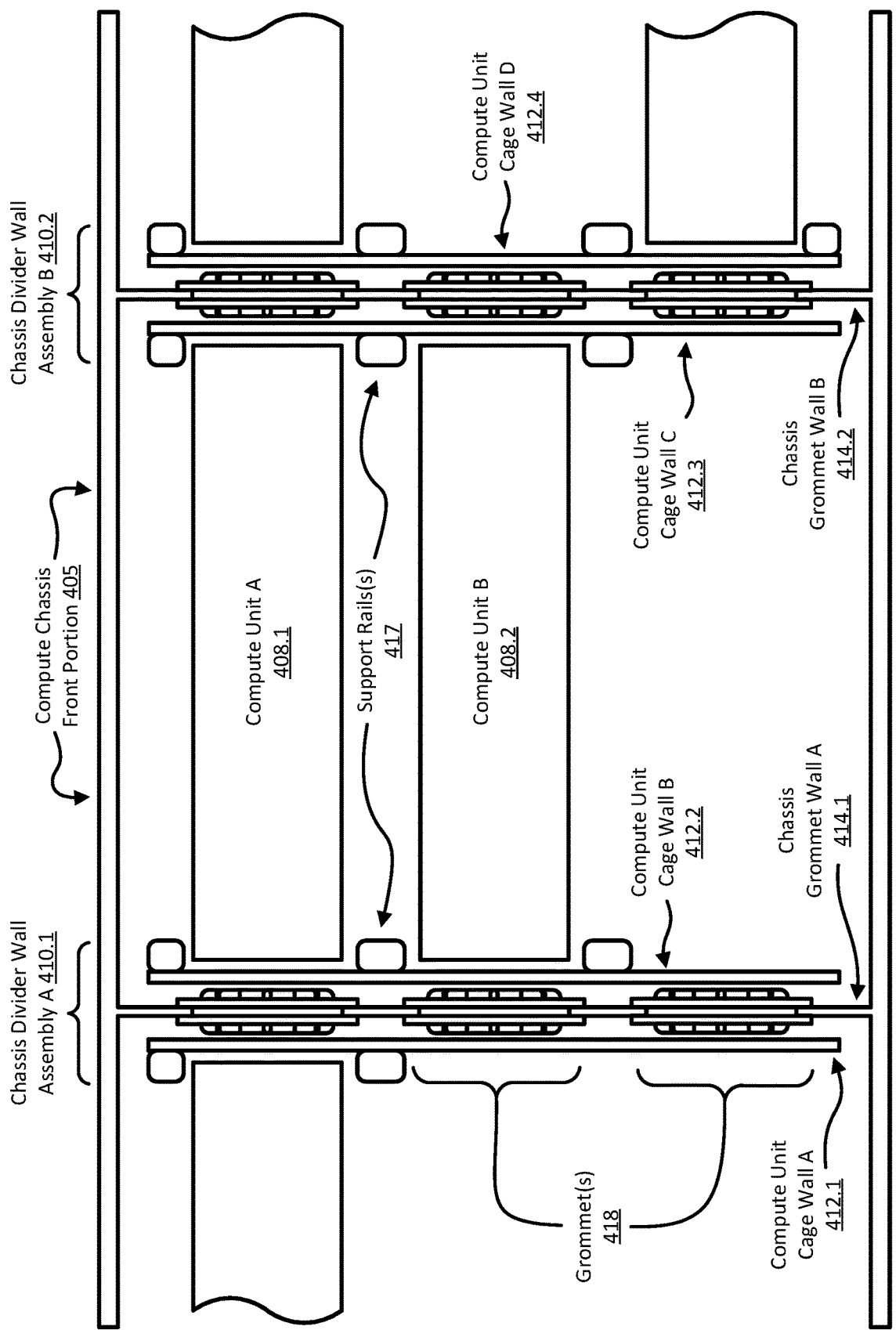
FIG. 4 shows an exploded diagram of front of a compute chassis, in accordance with one or more embodiments of the invention.

FIG. 4 shows an exploded diagram of a compute chassis front portion, in accordance with one or more embodiments of the invention. The compute chassis (404) may include one or more chassis divider wall assembly(ies) (e.g., chassis divider wall assembly A (410.1) and chassis divider wall assembly B (410.2)), one or more compute unit(s) (e.g., compute unit A (408.1) and compute unit B (408.2)), one or more support rail(s) (e.g., support rail(s) (417)). Each of these components is described below.

As discussed in the description of FIG. 3, in one or more embodiments of the invention, a chassis divider wall assembly (e.g., chassis divider wall assembly A (410.1) and chassis divider wall assembly B (410.2)) may include one or more compute unit cage wall(s) (e.g., compute unit cage wall A (412.1), compute unit cage wall B (412.2), a compute unit cage wall C (412.3), and compute unit cage wall D (412.4)), a chassis grommet wall (e.g., chassis grommet wall A (414.1) and chassis grommet wall B (414.2)), and one or more grommet(s) (e.g., grommet(s) (418)). Further, as shown in FIG. 4, the chassis grommet wall (414.1, 414.2) may be part of the same construction as the compute chassis (404) (e.g., or rigidly mechanically coupled via welding, brackets, and/or other rigid fasteners.

In one or more embodiments of the invention, when a compute unit (e.g., compute unit A (408.1)) is rigidly mechanically coupled to two compute unit cage walls (e.g., compute unit cage wall B (412.2) and compute unit cage wall C (412.3)), the combination of all three components may form a single rigid 'compute unit cage'. Further the 'compute unit cage' is flexibly mechanically coupled to two chassis grommet walls (e.g., chassis grommet wall A (414.1) and chassis grommet wall B (414.2)) and therefore flexibly mechanically coupled to the compute chassis (404), generally.

While FIG. 4 shows a specific configuration of a compute chassis, other configurations may be used without departing from the scope of the invention. Accordingly, embodiments disclosed herein should not be limited to the configuration of devices and/or components shown in FIG. 4.

Figure 5:
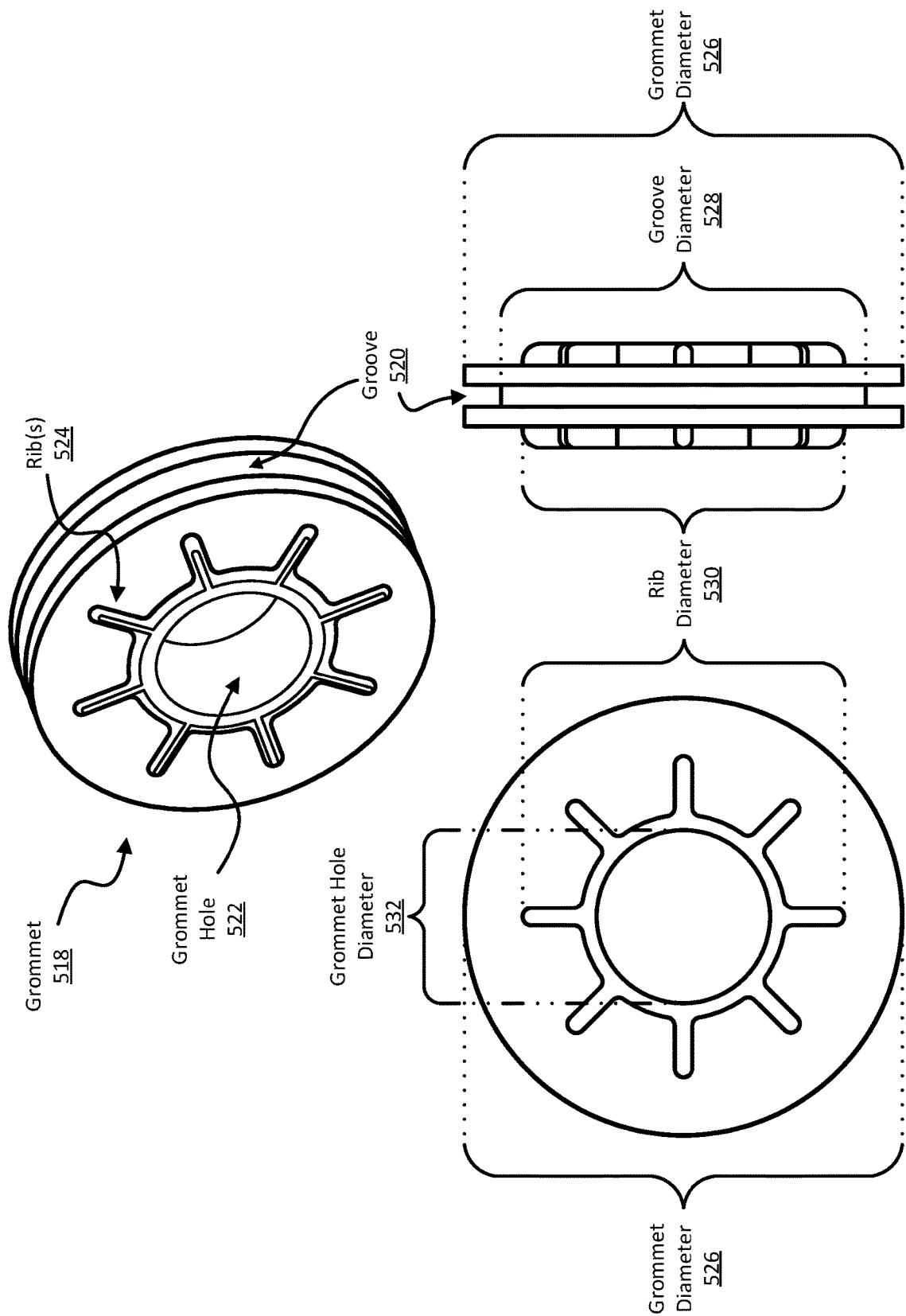
FIG. 5 shows a diagram of a grommet, in accordance with one or more embodiments of the invention.

FIG. 5 shows a diagram of a grommet, in accordance with one or more embodiments of the invention. In one or more embodiments of the invention, a grommet (e.g., grommet (518)) is hardware that provides mechanical coupling of one component to one or more other component(s). Further, grommet (518) provides vibration isolation and damping between two or more mechanically coupled components that are indirectly mechanically coupled through via the grommet (518). The grommet (518) may include a groove (e.g., groove (520)), a grommet hole (e.g., grommet hole (522)), one or more rib(s) (e.g., rib(s) (524)), a grommet diameter (e.g., grommet diameter (526)), a groove diameter (e.g., groove diameter (528)), a rib diameter (e.g., rib diameter (530)), and a grommet hole diameter (e.g., grommet hole diameter (532)). Each of these components is described below.

In one or more embodiments of the invention, the grommet (518) is constructed using a flexible and/or elastic material that allows for flexible mechanical coupling of two components. Accordingly, a grommet (518) reduces and/or eliminates the transmission of certain movements (e.g., vibrations) from one component to the other while still proving for mechanical coupling that prevents components from loosely shifting positions. Examples of materials that may construct a grommet (518) include various polymers (e.g., a viscoelastic urethane polymer, synthetic rubber, silicone, nitrile, styrene-butadiene rubber, neoprene, ethylene propylene), elastomers, other processed materials (natural rubber, leather, etc.), or any combination thereof.

In one or more embodiments of the invention, a groove (e.g., groove (520)) is a concave cavity that, at least, partially circumscribes (i.e., is located along a perimeter of) the grommet (518). The groove (520) may be constructed and formed by over-molding the grommet into and through one or more hole(s) of the chassis grommet wall. Accordingly, the shape of the groove may be complementary to the convex shape of the corresponding hole in the chassis grommet wall.

In one or more embodiments of the invention, a grommet hole (e.g., grommet hole (522)) is through hole that traverses the width of the grommet (518). A grommet hole (522) may allow for one or more fastening device(s) (not shown) to traverse the thickness of the grommet (518) and the chassis grommet wall without making direct physical contact with the chassis grommet wall. Accordingly, in one or more embodiments of the invention, a structure that traverses the grommet hole (522) remains insulated from the direct physical movements of the compute chassis (as all movements are through the grommet (518)).

In one or more embodiments of the invention, a rib (e.g., rib(s) (524)) is a protruding (e.g., raised) structure on one or more sides of the grommet (518). One or more rib(s) (524) may provide additional elastically deformable material that may be pressured against a surface (e.g., a compute unit cage wall). In one or more embodiments of the invention, a rib (524) may be take a different geometry than the underlying grommet (518). As a non-limiting example, as shown in FIG. 5, the ribs (524) may be "star"-shaped with two or more portions that extend outwards across a side surface of the grommet (518). Smaller portions on the surface of the grommet (518) (e.g., like the eight radially extending portions shown in FIG. 5) may provide additional vibration insulation. Specifically, when one or more rib(s) (524) are compressed, a thinner protruding portion of the rib (524) may be able to more easily to deform in a direction parallel to a side surface of the grommet (518) (as there is no other material in that volume to restrict deformation in that direction).

In one or more embodiments of the invention, a grommet diameter (e.g., grommet diameter (526)) is a length of the widest part of the grommet (518). Further, in embodiments of the invention where the grommet (518) is circular (as shown in FIG. 5), the grommet diameter (526) is the diameter of the outermost circular perimeter of the grommet (518).

In one or more embodiments of the invention, a groove diameter (e.g., groove diameter (528)) is a length of the narrowest depth of the groove (520) measured from one side of the grommet (518) to an opposite side of the grommet (518). Further, in embodiments of the invention where the grommet (518) is circular (as shown in FIG. 5), the groove diameter (526) is the diameter of the inner-most (closet to the center) circular perimeter of the groove (520).

In one or more embodiments of the invention, a rib diameter (e.g., rib diameter (530)) is a length of the outer most (i.e., furthest from the center of the grommet (518)) sides of the ribs (524) measured from one side of the ribs (524) to an opposite side of the ribs (524). Further, in embodiments of the invention where the grommet (518) is circular (as shown in FIG. 5), the rib diameter (530) is the diameter of the outer-most (furthest from the center) circular perimeter of the ribs (524).

In one or more embodiments of the invention, the groove diameter (528) is greater (i.e., larger) than the rib diameter (530). Accordingly, the thickness of the grommet (518) that includes the ribs (524) includes only the grommet material (and not the chassis grommet wall).

In one or more embodiments of the invention, a grommet hole diameter (e.g., grommet hole diameter (532)) is a length of the outer most sides (i.e., furthest from the center of the grommet (518)) of the grommet hole (522) measured from one side of the grommet hole (522) to an opposite side of the grommet hole (522). Further, in embodiments of the invention where the grommet hole (522) is circular (as shown in FIG. 5), the grommet hole diameter (532) is the diameter of the outer-most (furthest from the center) circular perimeter of the grommet hole (522).

One of ordinary skill in the art, having the benefit of this detailed description, would appreciate that a "diameter" of a non-circular geometry (e.g., in one or more embodiments where the grommet (518) is not circular) may be an "equivalent diameter" that provides some measurement of the length of the particular structure (e.g., ribs, groove, hole, overall) in particular dimension.

While FIG. 5 shows a specific configuration of a grommet, other configurations may be used without departing from the scope of the invention. For example, although the grommet of FIG. 5 is shown to be circular, the grommet may take any suitable shape complementary to a hole in a chassis grommet wall (around which the grommet is over-molded). Accordingly, embodiments disclosed herein should not be limited to the configuration of devices and/or components shown in FIG. 5.

Figure 6:
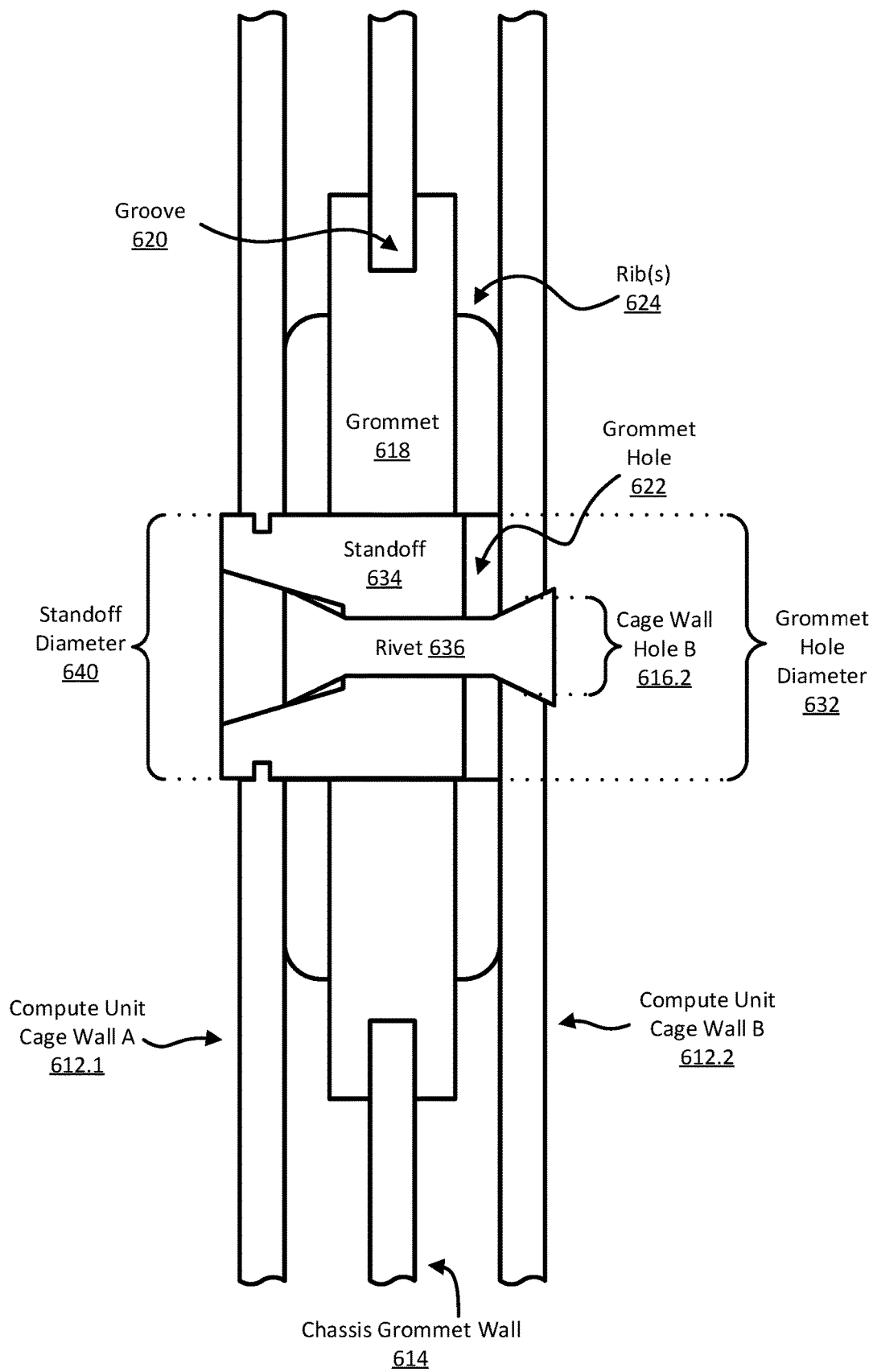
FIG. 6 shows a diagram of cutaway view of a grommet and compute unit cage walls, in accordance with one or more embodiments of the invention.

FIG. 6 shows a diagram of cutaway view of a grommet and compute unit walls, in accordance with one or more embodiments of the invention. The assembly of a grommet (618) and compute unit cage walls (612.1, 612.2) may include a grommet (e.g., grommet (618)), one or more compute unit cage wall(s) (e.g., compute unit cage wall A (612.1) and compute unit cage wall B (612.2)), a chassis grommet wall (e.g., chassis grommet wall (614)), a standoff (e.g., standoff (634)), and a rivet (e.g., rivet (636)). Further, a compute unit cage wall (e.g., compute unit cage wall B (612.2)) may be rigidly mechanically coupled to a standoff (e.g., standoff (634)). Each of these components is described below.

In one or more embodiments of the invention, a standoff (e.g., standoff (634)) is a structure that, at least partially, fills some of the volume of the grommet hole (622). The standoff (634) may provide one or more surface(s) on which a fastener may be mechanically coupled. As a non-limiting example, as shown in FIG. 6, the standoff (634) has a concave conical interior portion and a through hole that allows thinner portion of rivet (636) to traverse the through hole but not allow the widest outer portion to pass through the thickness of the standoff (634). In one or more embodiments of the invention, the standoff (634), as shown in FIG. 6, is rigidly mechanically coupled to a compute unit cage wall (e.g., compute unit cage wall A (612.1)).

In one or more embodiments of the invention, a standoff diameter (e.g., standoff diameter (640)) is a length of the outer most (i.e., furthest from the center of the grommet (618)) sides of the standoff (634) measured from one side of the standoff (634) to an opposite side of the standoff (634). Further, in embodiments of the invention where the standoff (634) is circular (as shown in FIG. 5), the standoff diameter (640) is the diameter of the outer-most (furthest from the center) circular perimeter of the standoff (634). In one or more embodiments of the invention, the standoff diameter (640) may be larger than the grommet hole diameter (i.e., the diameter of the grommet hole (622)) such that, when inserted, the standoff (634) displaces some of the grommet (618) material outwards and away from the grommet hole (622). Further, a standoff (634) with a larger standoff diameter (640) than grommet hole (622) provides a constant outward pressure for the grommet (618) thereby controlling a "grommet compression height".

In one or more embodiments of the invention, a rivet (e.g., rivet (636)) is fastener. In one or more embodiments, a fastener is hardware that provides means for mechanically coupling one component to another component (e.g., compute unit cage wall A (612.1) and compute unit cage wall B (612.2)). Non-limiting examples of a fasteners include rigid fasteners (e.g., rivets (e.g., rivet (636)), screws, machine screws, bolts, nuts, nails, pins, cable ties, etc.), semi-rigid fasteners (e.g., adhesive tape, hook-and-loop fasteners, glue, etc.), rigid fasteners that allow for limited movement (e.g., links/chains, ball-and-socket connections, hinges). As shown in FIG. 6, the fastener may be a rivet (636) that, when installed (stressing the rivet), provides compression to the other components of assembly. One of ordinary skill in the art, having the benefit of this detailed description, would appreciate that different means for fastening may be used instead of the rivet (636) shown in FIG. 5.

In one or more embodiments, a fastener (e.g., rivet (636)) may be used to mechanically couple two components and provide pressure one or more other component(s) disposed therebetween. As a non-limiting example, as shown in FIG. 5, the grommet (618) is pressured between compute unit cage wall A (612.1) and compute unit cage wall B (612.2) via the tightening of the fastener (e.g., rivet (636)) that mechanically couples the compute unit cage walls A and B (612.1, 612.2). Accordingly, although grommet (618) may not be in direct contact with a fastener, the grommet (618) is nonetheless mechanically coupled to the compute unit cage walls (612.1, 612.2) via the pressure created by rivet (636).

While FIG. 6 shows a specific configuration of a grommet and compute unit walls, other configurations may be used without departing from the scope of the invention. Accordingly, embodiments disclosed herein should not be limited to the configuration of devices and/or components shown in FIG. 6.

While one or more embodiments have been described herein with respect to a limited number of embodiments and examples, one of ordinary skill in the art, having the benefit of this detailed description, would appreciate that other embodiments can be devised which do not depart from the scope of the embodiments disclosed herein. Accordingly, the scope should be limited only by the attached claims.

What is claimed is:

1. A compute chassis, comprising:
   a chassis divider wall assembly comprising:
   a chassis grommet wall disposed vertically comprising a first side, a second side, and a hole;
   a grommet comprising a groove and at least partially disposed within the hole and mechanically coupled to the chassis grommet wall using the groove; and
   a first compute unit cage wall arranged vertically in contact with a first portion of the grommet, wherein the first portion of the grommet is interposed between the first compute unit cage wall and the first side; and
   a second compute unit cage wall arranged vertically in contact with a second portion of the grommet, wherein the second portion of the grommet is interposed between the second compute unit cage wall and the second side, wherein the second compute unit cage wall is rigidly mechanically coupled to the first compute unit cage wall,
   wherein a first compute unit is arranged horizontally and mechanically coupled to the first compute unit cage wall, and a second compute unit is arranged horizontally and mechanically coupled to the second compute unit cage wall.

2. The compute chassis of claim 1, wherein the first compute unit cage wall and the second compute unit cage wall are rigidly mechanically coupled to a compute unit rear cage wall, wherein the compute unit rear cage wall comprises a compute unit interface configured to interact with a compute unit.

3. The compute chassis of claim 1, wherein the first compute unit cage wall and the second compute unit cage wall are rigidly mechanically coupled using a rivet.

4. The compute chassis of claim 3, wherein a standoff is disposed between the rivet and the grommet, wherein the standoff controls a grommet compression height.

5. The compute chassis of claim 4, wherein the standoff is not in direct contact with the chassis grommet wall.

6. The compute chassis of claim 4, wherein the first compute unit cage wall and the second compute unit cage wall are further mechanically coupled using the standoff.

7. The compute chassis of claim 1, wherein a groove diameter of the groove is greater than a rib diameter of the grommet.

8. The compute chassis of claim 1, wherein the groove is located along an entire perimeter of the grommet.

9. The compute chassis of claim 1, wherein the chassis divider wall assembly comprises a plurality of grommets and wherein the grommet is one of the plurality of grommets.

10. An information handling system, comprising:
    a chassis divider wall assembly comprising:
    a chassis grommet wall disposed vertically comprising a first side, a second side, and a hole;
    a grommet comprising a groove and at least partially disposed within the hole and mechanically coupled to the chassis grommet wall using the groove; and
    a first compute unit cage wall arranged vertically in contact with a first portion of the grommet, wherein the first portion of the grommet is interposed between the first compute unit cage wall and the first side;
    a second compute unit cage wall arranged vertically in contact with a second portion of the grommet, wherein the second portion of the grommet is interposed between the second compute unit cage wall and the second side, wherein the second compute unit cage wall is rigidly mechanically coupled to the first compute unit cage wall;
    a first compute unit arranged horizontally and mechanically coupled to the first compute unit cage wall; and
    a second compute unit arranged horizontally and mechanically coupled to the second compute unit cage wall.

11. The information handling system of claim 10, wherein the first compute unit is hot swappable.

12. The information handling system of claim 10, wherein the first compute unit cage wall and the second compute unit cage wall are rigidly mechanically coupled to a compute unit rear cage wall, wherein the compute unit rear cage wall comprises a compute unit interface configured to interact with a compute unit.

13. The information handling system of claim 10, wherein the first compute unit cage wall and the second compute unit cage wall are mechanically coupled using a rivet.

14. The information handling system of claim 13, wherein a standoff is disposed between the rivet and the grommet, wherein the standoff controls a grommet compression height.

15. The information handling system of claim 14, wherein the standoff is not in direct contact with the chassis grommet wall.

16. The information handling system of claim 14, wherein the first compute unit cage wall and the second compute unit cage wall are further mechanically coupled using the standoff.

17. The information handling system of claim 10, wherein a groove diameter of the groove is greater than a rib diameter of the grommet.

18. The information handling system of claim 10, wherein the groove is located along an entire perimeter of the grommet.

19. The information handling system of claim 10, wherein the chassis divider wall assembly comprises a plurality of grommets and wherein the grommet is one of the plurality of grommets.

* * * * *